(12) United States Patent
Nakase et al.

(10) Patent No.: US 6,377,968 B1
(45) Date of Patent: Apr. 23, 2002

(54) DIGITAL FILTERING CIRCUIT

(75) Inventors: Junko Nakase, Kodaira; Takashi Nakamoto, Tama, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/291,956

(22) Filed: Apr. 15, 1999

(30) Foreign Application Priority Data

Apr. 16, 1998 (JP) ............................................. 10-106116

(51) Int. Cl.[7] .............................................. G06F 17/10
(52) U.S. Cl. ....................................... 708/319; 708/316
(58) Field of Search ................................. 708/319, 316

(56) References Cited

U.S. PATENT DOCUMENTS

| | | | |
|---|---|---|---|
| 5,050,119 A | * 9/1991 | Lish | 708/319 |
| 5,222,035 A | * 6/1993 | Nakase et al. | 708/319 |
| 5,245,561 A | * 9/1993 | Sugiyama | 708/319 |
| 5,436,859 A | * 7/1995 | Lunner et al. | 708/319 |
| 5,699,370 A | 12/1997 | Kaniwa et al. | |
| 6,032,171 A | * 2/2000 | Kiriaki et al. | 708/319 |
| 6,035,312 A | * 3/2000 | Hasegawa | 708/319 |

FOREIGN PATENT DOCUMENTS

| | | |
|---|---|---|
| EP | 667720 | 8/1995 |
| WO | WO97/26733 | 7/1997 |

* cited by examiner

*Primary Examiner*—Tan V. Mai
(74) *Attorney, Agent, or Firm*—Mattingly, Stanger & Malur, P.C.

(57) ABSTRACT

There is provided a filtering circuit whose circuit scale is small and which is suitable for a digital data string in which data of luminance signals Y and color-difference signals Cb and Cr are regularly inserted or multiplexed. The digital filtering circuit includes a delay line composed of a plurality of D flip-flops which is operative with frequency of the data string in which the luminance signals Y and the color-difference signals Cb and Cr are regularly inserted or multiplexed a plurality of multipliers for multiplying a plurality of taps of the delay line by respective coefficients and an adder for adding outputs of said multipliers, wherein the taps connected to the multipliers is switched by selectors. It allows one digital filtering circuit to be used for processing the signals Y, Cb and Cr in a time division manner to realize the digital filtering circuit which uses less multipliers and adders and whose circuit scale is small.

7 Claims, 8 Drawing Sheets

DIGITAL FILTERING CIRCUIT

BACKGROUND OF THE INVENTION

1. Field of the Invention

The present invention relates to a digital filtering circuit for filtering digital data and more specifically to a digital filtering circuit suitable for filtering an inputted digital video signal in which a luminance signal and color-difference signals are multiplexed in unit of byte (8 bits). The invention also relates to a digital filtering circuit for processing the digital video signal suitably formed in a semiconductor integrated circuit device.

2. Description of the Related Art

A coding format called ITU-R (International Telecommunication Union—Radio communication) Recommendation BT. 601 (hereinafter referred to as BT. 601) is used often in general as an input format of a digital video signal. Recommendation BT. 601 will be explained below.

Utilizing the fact that the human is not so sensitive to colors, Recommendation BT. 601 reduces color information to a half in the horizontal direction. Sampling frequency of a luminance signal Y is set at 13.5 MHz and sampling frequency of two color-difference signals Cb and Cr is set at 6.75 MHz, i.e., a half of the former. Accordingly, the ratio of the sampling frequencies of the luminance signal Y, the color-difference signal Cb and the color-difference signal Cr is 4:2:2. From this point, this format is called a 4:2:2 coding system or a 4:2:2 digital component signal. Here, the luminance signal Y, the color-difference signal Cb and the color-difference signal Cr are digital data of 8 bits, respectively, per one pixel. That is, the quantizing accuracy is 8 bits. It is noted that when primary color signals are R (red), G (green) and B (blue), the color-difference signal Cb is a digital signal of a difference (B−Y) and the color-difference signal Cr is a digital signal of a difference (R−Y). Although a 4:4:4 coding system and a system in which quantizing accuracy of each of the signals Y, Cb and Cr is set at 10 bits are also stipulated in the format of BT. 601, the 8-bit 4:2:2 system which is widely used in general will be explained below.

FIG. 7 shows an outline of the format of Recommendation BT. 601. In BT. 601, data are lined in order of pixel 0, 1, 2, . . . from the left of the screen until 719. Among them, data of the color-difference signals Cb and Cr exist for the pixels affixed with even numbers (0, 2, 4, . . . 718). When the luminance signal Y and the color-difference signals Cb and Cr of a pixel n are represented by Yn, Cbn and Crn, respectively, the data turns out to be a data string in which the luminance signal Y is inserted (interleaved) every other data (per two periods) and the color-difference signals Cb and Cr are inserted every three data (per four periods) regularly in the horizontal direction like Cb0, Y0, Cr0, Y1, Cb2, Y2, Cr2, Y3, . . . In other words, the luminance signal Y and the color-difference signals Cb and Cr may be considered to be multiplexed. The data is transmitted in synchronism with a transmission clock of 27 MHz in line in the horizontal direction in order from the smaller line number (in order of pixel 0, 1, 2, . . . ). Accordingly, the data string or the data stream of Recommendation BT. 601 is a data string or a data stream in which the luminance signals Y, color-difference signals Cb and Cr are interleaved respectively in unit of 8 bits and which is synchronized with the clock of 27 MHz.

It is noted that there is a case when a filtering process is implemented to the digital video signal inputted in the format of the above-mentioned Recommendation BT. 601 for the purpose of removing noises and of restricting a band in systems handling the digital video signal such as a digital broadcasting receiver, a digital camera and a video phone.

A case of implementing a filtration operation on the data string of Recommendation BT. 601 by a known transversal filter in the horizontal direction will be explained below.

It is noted that although the transversal filter itself is known, the structure of a digital filtering circuit shown in FIGS. 2 and 4, i.e., a combination circuit of the transversal filter and a timing operation explained in FIGS. 3 and 5 are not publicly known and are a digital filtering circuit and its timing operation discussed by the inventors in the process of devising the present invention.

In implementing the filtration operation by the transversal filter, it is conceivable of implementing the filtering process in the independent digital filtering circuits respectively after separating the luminance signal Y and the two color-difference signals Cb and Cr from the data string in which the luminance signals and the color-difference signals are multiplexed.

FIG. 2 shows the structure of the digital filtering circuit in performing filtration operations of three taps. In the digital filtering circuit in FIG. 2, filtration operating sections of the luminance signal Y and the color-difference signals Cb and Cr are formed independently from each other. Each of the filtration operating sections 201, 202 and 203 which are set as the transversal filter comprises a delay line composed of three D flip-flops 10, three multipliers 30, 31 and 32 for multiplying the three taps of the delay line by adequate tap coefficients a0, a1 and a2 and an adder 40 for adding and outputting the result of the three multipliers. It is noted that each D flip-flop 10 is a D flip-flop of 8 bits and latches input data at the rising edge of clocks clk2, clk3 and clk4 to be supplied.

The D flip-flop 10 at the input stage of each of the filtration operating sections 201, 202 and 203 separates data from an input node IN by receiving clocks clk2, clk3 and clk4 which are generated by a clock generator circuit 60 described later and which are different from each other.

FIG. 3 is a timing chart of the clock input and output data d0, d1 and d2 of the D flip-flop 10 on each input stage. The clock clk2 of 13.5 MHz is used for the luminance signal Y and the clocks clk3 and clk4 of 6.75 MHz are used for the color-difference signals Cb and Cr, respectively, as the clock inputted to the input stage D flip-flop 10. These clocks clk2, clk3 and clk4 are generated by the clock generator circuit 60 based on a clock clk1 of 27 MHz which is synchronism with the data string of BT. 601 inputted from the input node IN. As shown in the time chart in FIG. 3, the data string inputted from the input node IN may be separated into data strings of the luminance signal Y, the color-difference signal Cb and the color-difference signal Cr like the output data d0, d1 and d2, respectively, and the filtering operation may be implemented independently by latching at the rising edge of the clocks clk2, clk3 and clk4.

Next, a digital filtering circuit in filtering in two directions of the horizontal and vertical directions will be explained. FIG. 4 shows the structure of the digital filtering circuit in implementing the filtering process of three taps both in the horizontal and vertical directions as an example. This digital filtering circuit will be explained below.

The digital filtering circuit in FIG. 4 is what a filtration operating section comprising a horizontal direction filtering section and a vertical direction filtering section is structured for the luminance signal Y, the color-difference signal Cb and the color-difference signal Cr independently from each other. The configuration of the horizontal direction filtering section HF is equal to that of the digital filtering circuit in FIG. 2. The vertical direction filtering section VF comprises a delay line composed of two line memories, three multipliers 33, 34 and 35 for multiplying three taps of the delay line by tap coefficients, respectively, and an adder 41 for adding outputs of the three multipliers in each filtration operating section.

Each line memory is a FIFO (First In First Out) memory and has a data capacity of one line of data string to be processed in each of the filtration operating sections 401, 402 and 403. That is, line memories 50a and 50b of the filtration operating section 401 of the luminance signal Y has 720 bytes corresponding to a number of pixels of one line and line memories 51a and 51b of the filtration operating sections 402 and 403 of the color-difference signals Cb and Cr have 360 bytes which is a half of the number of pixels of one line, respectively. The filtration operating section 401 of the luminance signal Y will be exemplified below to explain the operation of the digital filtering circuit in FIG. 4.

The filtration operating section 401 of the luminance signal Y separates the data string of the luminance signal Y from the interleaved data string by the D flip-flop 10 at the input stage in the horizontal direction filtering section HF at first and performs the filtering process of the three taps in the horizontal direction on the data string of the luminance signal Y. That is, the multipliers 30, 31 and 32 multiply the Y data of the respective taps delayed by each flip-flop 10 by the tap coefficient and the adder 40 adds the results of the multiplication and outputs as the result of the filtering process in the horizontal direction. The output of the filtration of the horizontal direction filtering section HF is sent to the line memory 50a. Output data LM1 of the line memory 50a becomes data of the luminance signal Y of a pixel of input data LM0 of the line memory 50a of one line before. Similarly to that, an output LM2 of the second line memory 50b becomes data of the luminance signal Y of a pixel of the input data LM1 of the line memory 50b of one line before. Accordingly, the data LM0, LM1 and LM2 become data of the luminance signal Y of the pixels continued in the vertical direction.

In the vertical direction filtering section VF, these data LM0, LM1 and LM2 are set as three taps of the filter, the multipliers 33, 34 and 35 multiply the respective taps by tap coefficients and the adder 41 adds the results of the multiplication. An output of the adder 41 becomes an output of filtration of the filtration operating section 401. It is the same also in each of the filtration operating sections 402 and 403 of the color-difference signals Cb and Cr. That is, the filtration operation may be implemented in the horizontal and vertical directions for the respective data of the luminance signal Y, the color-difference signal Cb and the color-difference signal Cr in the digital filtering circuit shown in FIG. 4.

However, the digital filtering circuits having the configurations as shown in FIGS. 2 and 4 comprise the three filtration operating sections having the same structure independently with respect to each data string of the luminance signal Y, the color-difference signal Cb and the color-difference signal Cr. Therefore, a number of the multipliers in one filtration operating section becomes large in a digital filtering circuit having a large number of taps and along that, a circuit scale of the adder for adding the multiplication results becomes large. It has been clarified by the study conducted by the inventor that when the circuit scale of one filtration operating section is large as such, the circuit scale of the whole digital filtering circuit which is three times of that becomes enormous.

Accordingly, when the digital filtering circuit constructed as described above is formed within a semiconductor integrated circuit device, an area on a semiconductor chip occupied by the digital filtering circuit has been widened and it has been difficult to lower the cost of the semiconductor integrated circuit device as a result.

SUMMARY OF THE INVENTION

It is an object of the present invention to provide a digital filtering circuit whose circuit scale is small and which is suitable for filtering a digital video signal.

It is another object of the invention to provide a digital filtering circuit for processing a digital video signal whose circuit scale is small so that it is suitably formed within a semiconductor integrated circuit device.

An outline of typical ones of the invention disclosed in the present application may be explained as follows.

That is, a digital filtering circuit of a first configuration of the invention is a filtering circuit for filtering a data string or a data stream in which data of a plurality of data string or data stream elements are regularly and periodically inserted or multiplexed. The digital filtering circuit of the first configuration of the invention comprises a delay line composed of at least $(f1/f2) \times (N-1)$ D flip-flops, where f1 is transmission frequency of the data string, f2 is transmission frequency of a data string element whose transmission frequency is least among the data string elements contained in the data string and N is a number of taps; a plurality of multipliers for multiplying the plurality of taps of the delay line by respective coefficients; and an adder for adding outputs of the multipliers; wherein the delay line is operated with the transmission frequency f1 of the data string and there is provided means for processing the plurality of data string elements in a time division manner.

For instance, the delay line is composed of eight D flip-flops when the transmission frequency f1 of the data string is in the relationship of f1=27 MHz, the least transmission frequency f2 of the data string element is in the relationship of f2=6.75 MHz and the number of taps N=3.

A digital filtering circuit of a second configuration of the invention is a filtering circuit for filtering a data string in which data of a plurality of data string elements in which transmission frequency of at least one data string element is different from transmission frequency of the other data string element are regularly and periodically inserted.

The digital filtering circuit of the second configuration comprises a delay line composed of $(f1/f2) \times (N-1)$ D flip-flops, where f1 is transmission frequency of the data string, f2 is transmission frequency of a data string element whose transmission frequency is least among the data string elements contained in the data string and N is a number of taps; a plurality of selecting means for selecting and outputting one out of two or more taps other than a center tap among the plurality of taps of the delay line; a plurality of multipliers for multiplying output data of the plurality of selecting means and data of the center tap by coefficients, respectively; and an adder for adding outputs of the multipliers.

The delay line is operated with the transmission frequency f1 of the data string. Meanwhile, the selecting means process the plurality of data string elements by switching the taps connected to the multipliers so that the interval between the taps becomes f1/f3 of D flip-flops based on the center tap, where f1 is the transmission frequency of the data string and f3 is the transmission frequency of the data string element to which data outputted to the center tap at the time selected by the selecting means belongs.

By constructing as described above, the D flip-flops are operated with the frequency of the input data string when the data string elements are data of the luminance signal Y of 13.5 MHz and data of the color-difference signals Cr and Cb of 6.75 MHz and when the frequency of the data string in which the data of those data string elements are regularly and periodically inserted or multiplexed is f1=27 MHz. Then, the selector circuits as the selecting means switch the taps connected to the multipliers so that the intervals of the taps selected by the selector circuits is (frequency of the data string f1=27 MHz)/(frequency of the data string element to which data outputted to the center tap at that time belongs (f3=13.5 MHz in case of the luminance signal Y and f3=6.75 MHz in case of the color-difference signals Cb and Cr)) of the D flip-flops, i.e., two or four D flip-flops based on the center tap. That is, the plurality of multipliers and the adder within the digital filtering circuit may be used for filtering the luminance signal Y and the color-difference signals Cb and Cr in a time division manner by selectively switching the outputs of the D flip-flops connected with the multipliers by the selecting means. In other words, the plurality of multipliers and the adder within the digital filtering circuit are shared in filtering the luminance signal Y and the color-difference signals Cb and Cr. This means that the circuit scale of the digital filtering circuit may be reduced.

Accordingly, it is possible to reduce the cost of a semiconductor integrated circuit device as a result even when the digital filtering circuit constructed as described above is formed within the semiconductor integrated circuit device because of a decrease in an area occupied by the digital filtering circuit on a semiconductor chip on which the semiconductor integrated circuit device is formed.

A digital filtering circuit of a third configuration of the invention contains a first filtering circuit and a second filtering circuit for receiving an output of the first filtering circuit.

The first filtering circuit is the digital filtering circuit of the first configuration or the digital filtering circuit of the second configuration described above.

Meanwhile, the second filtering circuit is coupled so as to receive the output of the digital filtering circuit of the first or second configuration.

The second filtering circuit is a digital filtering circuit for filtering in a second direction to unit of data having a two-dimensional structure in which data of a plurality of data string elements of one line are regularly and periodically inserted or multiplexed in a first direction and data of the same data string element among the above-mentioned plurality of data string elements are arrayed in the second direction orthogonal to the first direction.

The second filtering circuit comprises a FIFO memory having a capacity for storing at least one line of the data string in the first direction, a plurality of multipliers for multiplying a plurality of taps which are set at an input of the FIFO memory and at the position of data interval of n lines (n is an integer of 1 or more) from the input of the FIFO memory by respective coefficients, and an adder for adding respective outputs of the plurality of multipliers. Then, the digital filtering circuit is arranged such that the FIFO memory is operated with the frequency of the data string and the process of the plurality of data string elements is performed in a time division manner.

In the digital filtering circuit of the third configuration, the first filtering circuit is a horizontal direction filtering circuit section and the second filtering circuit is a vertical direction filtering circuit section.

According to the configuration described above, the plurality of multipliers and the adder of the first filtering circuit and the plurality of multipliers and the adder of the second filtering circuit are shared in filtering the luminance signal Y and the color-difference signals Cb and Cr.

Accordingly, the cost of the semiconductor integrated circuit device may be reduced as a result even when the digital filtering circuit of the third configuration is formed within the semiconductor integrated circuit device because an area occupied by the digital filtering circuit of the third configuration on the semiconductor chip on which the semiconductor integrated circuit device is formed is reduced.

The specific nature of the invention, as well as other objects, uses and advantages thereof, will clearly appear from the following description and from the accompanying drawings in which like numerals refer to like parts.

DESCRIPTION OF THE PREFERRED EMBODIMENTS

Preferred embodiments of a digital filtering circuit of the invention will be explained below in detail with reference to the drawings.

Figure 1:
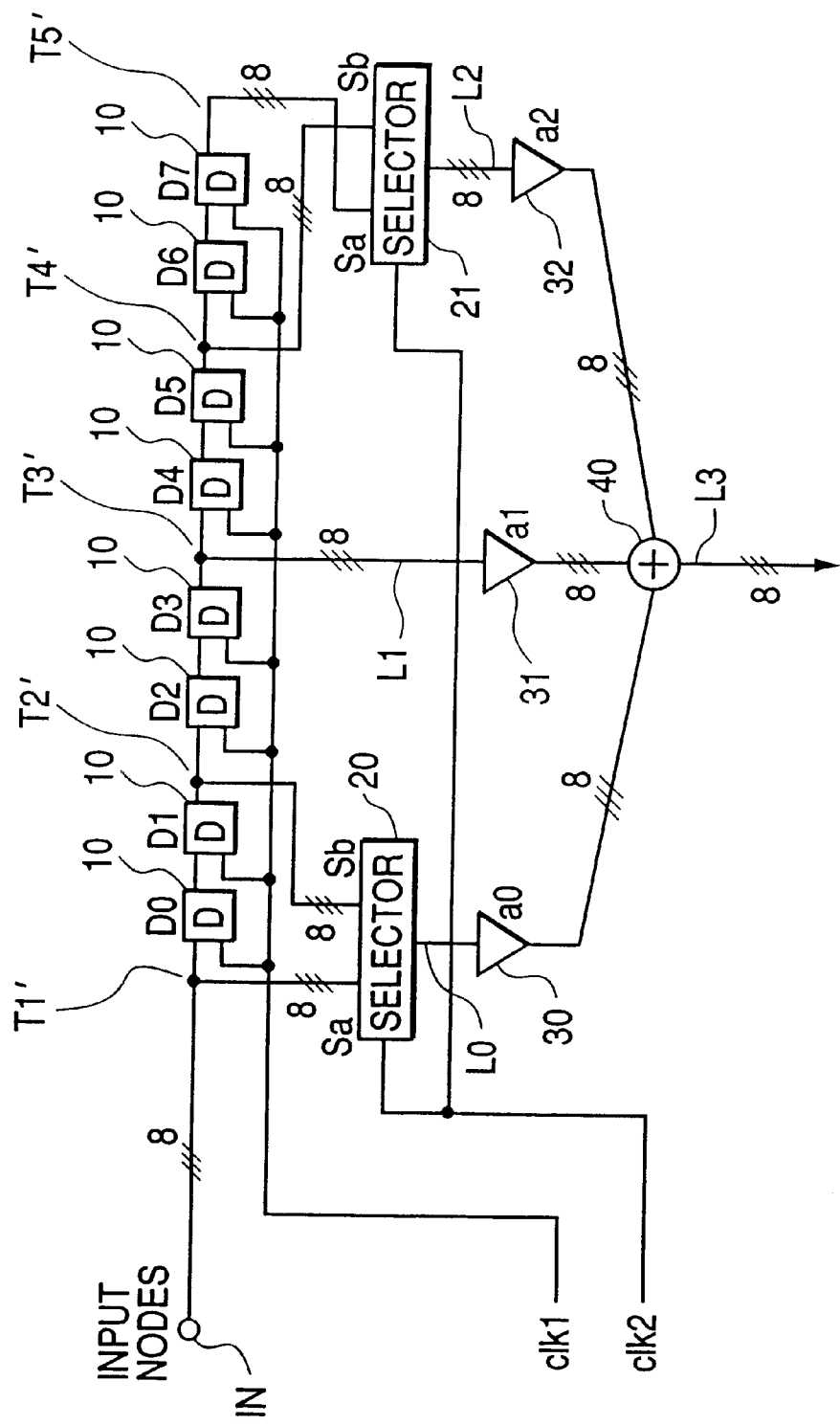
FIG. 1 is a circuit structural diagram showing one embodiment of a digital filtering circuit of the invention.
Figure 2:
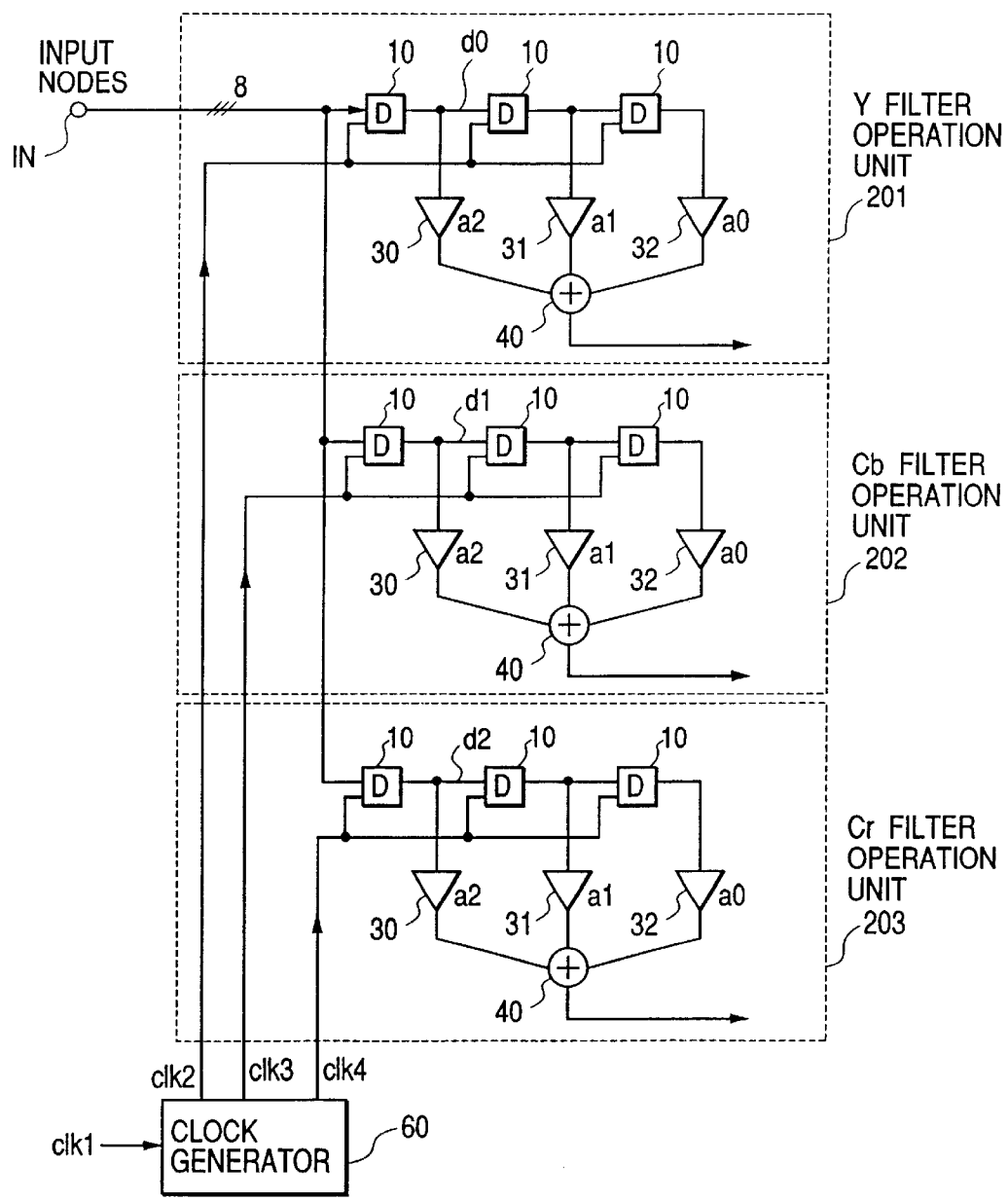
FIG. 2 is a circuit structural diagram showing an example of a digital filtering circuit studied by the inventor of the present application.
Figure 7:
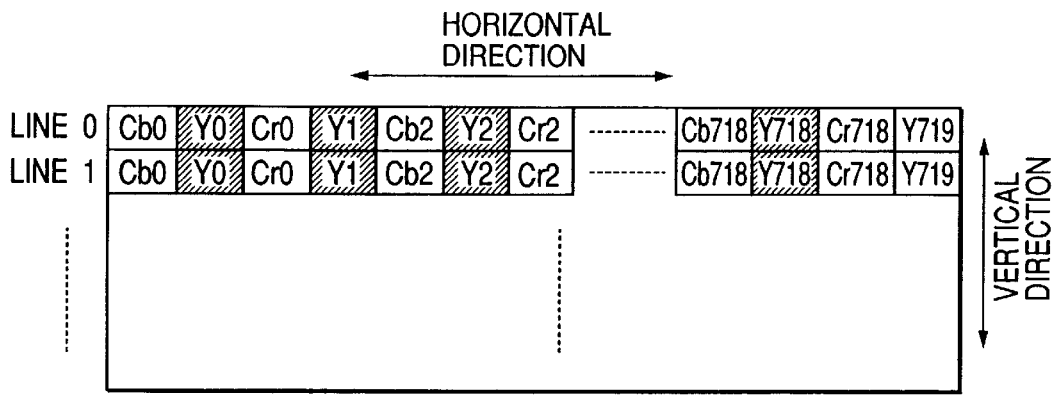
FIG. 7 is a chart for explaining a format of ITU-R Recommendation BT. 601.

FIG. 1 is a circuit structural diagram showing one embodiment of a digital filtering circuit of the invention. The digital filtering circuit shown in FIG. 1 implements a filtering process of three taps in the horizontal direction on a digital video signal explained in FIG. 7, i.e., an input data string data stream in which the luminance signals Y, the color-difference signals Cb and the color-difference signals Cr are inserted (interleaved) regularly and periodically. The input format of the digital video signal is the coding format called Recommendation BT. 601 (hereinafter referred to as BT. 601) as described before. In BT. 601, sampling frequency of the luminance signal Y is 13.5 MHz and sampling frequency of two color difference signals Cb and Cr is 6.75 MHz, i.e., a half of the sampling frequency of the luminance signal Y. The luminance signal Y, the color-difference signal Cb and the color-difference signal Cr are digital data of 8 bits, respectively, for one pixel. Then, data of the luminance signal Y, color-difference signal Cb and color-difference signal Cr of 8 bits are supplied continuously in parallel and in accordance to a predetermined order to an input node IN in FIG. 1. That is, the filtering circuit in FIG. 1 has a parallel interface. It is noted that when primary color signals are R (red), G (green) and B (blue), the color-difference signal Cb is represented by a digital signal of a difference (B−Y) and the color-difference signal Cr is represented by a digital signal of a difference (R−Y), as is well known to those skilled in the art. When the luminance signal Y and the color-difference signals Cb and Cr of a pixel n (n: an integer from 0 to 719) are represented by Yn, Cbn and Crn, respectively, it turns out to be a data string in which the luminance signal Y is inserted or multiplexed every other data (per two periods) and the color-difference signals Cb and Cr are inserted or multiplexed alternately every three data (per four periods) in the horizontal direction like Cb0, Y0, Cr0, Y1, Cb2, Y2, Cr2, Y3, . . . Data transmission frequency is synchronized with a transmission clock of 27 MHz and the data is transmitted in the line of the horizontal direction in order from the smaller line number (in order of pixel 0, 1, 2, . . . ). Accordingly, the data string or the data stream is a data string or a data stream in which the luminance signals Y, color-difference signals Cb and Cr are regularly inserted respectively in unit of 8 bits and which is synchronized with the clock of 27 MHz.

Figure 8:
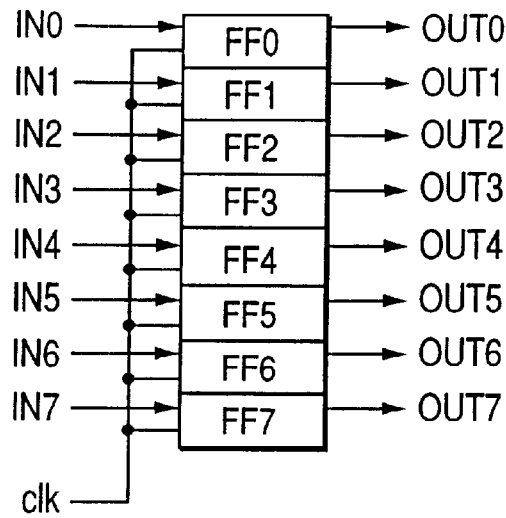
FIG. 8 shows an example of a circuit of a D flip-flop as a delay line.

The digital filtering circuit shown in FIG. 1 comprises eight D flip-flops 10 as a delay line. Each D flip-flop 10 is a D flip-flop of 8 bits and latches 8-bit data comprehensively at the rising edge of a clock clk1 for example. Here, these eight D flip-flops 10 are denoted by D0, D1, . . . , D7 from the side close to the input node IN. That is, the respective D flip-flops D0 through D7 have eight flip-flops FF0 through FF7 as shown in FIG. 8 and the respective flip-flops FF0 through FF7 have input terminals IN0 through IN7, output terminals OUT0 through OUT7 and clock input terminals for supplying clock signals clk. The input terminals IN0 through IN7 of the respective flip-flops FF0 through FF7 are coupled with the input node IN and output terminals OUT0 through OUT7 of respective flip-flops FF0 through FF7 within a D flip-flop of the previous stage.

Selectors 20 and 21 are connected with taps T1', T2', T4' and T5' of this delay line. The selector 20 selects and outputs either one of a first terminal Sa inputting an input signal from the input node IN (tap T1') or a second terminal Sb inputting an output of the D flip-flop D1 (tap T2') corresponding to a signal level of a clock signal clk2. The selector 21 selects and outputs either one of a first terminal Sa inputting an output of the D flip-flop D5 (tap T4') or a second terminal Sb inputting an output of the D flip-flop D7 (tap T5') corresponding to a signal level of the clock signal clk2. The outputs of the selectors 20 and 21 are connected respectively to the multipliers 30 and 32 for multiplying tap coefficients a0 and a2. An output of the D flip-flop D3 (tap T3') is connected to the multiplier 31 for multiplying a tap coefficient a1 without going through the selectors 20 and 21 as the center tap. The adder 40 adds respective outputs L0, L1 and L2 of the multipliers 30, 31 and 32 and outputs as a filter output L3.

The operation of the digital filtering circuit described above will be explained below by using a time chart shown in FIG. 5. It is noted that a gate delay is neglected here in order to simplify the explanation. Those denoted as D0 through D7 in FIG. 5 indicate the outputs of the D flip-flops D0 through D7 shown in FIG. 1.

The D flip-flops D0 through D7 are arranged as described above so as to receive the clock clk1 of 27 MHz synchronized with the input data string as a control clock to control timing of data input by the clock clk1. Thereby, the output data of the D flip-flops D0 through D6 are latched respectively by the D flip-flops D1 through D7 on the right of them by one each corresponding to the rising edge of the clock clk1. That is, the output data of the D flip-flops D0 through D6 are shifted to the D flip-flops D1 through D7 on the right side of them by one each.

For instance, a value of the color-difference signal Cr2 which is an output of the D flip-flop D0 at time t turns out to be an output of the D flip-flop D1 at time (t+1). It is noted that the unit of time t is 1/27 MHz here.

The clock clk2 of 13.5 MHz is used as a control signal of the selectors 20 and 21. The clock clk2 may be generated readily by dividing the clock clk1 into a half. The selectors 20 and 21 both output the input signal supplied to the first terminal Sa as an output signal when the signal level of the clock clk2 is at low level "0" as a first signal level and output the input signal supplied to the second terminal Sb as an output signal when the signal level of the clock clk2 is at high level "1" as a second signal level.

That is, the selector 20 selects the input data from the input node IN (node of the tap T1') when the clock clk2 is at low level "0" and selects the output of the D flip-flop D1 (node of the tap T2') when the clock clk2 is at high level "1". As a result, the output L0 of the selector 20 turns out in order of Cr0, Y0, Cb2, Y1, Cr2, . . . as shown in the time chart in FIG. 5. The selector 21 selects the output of the D flip-flop D7 (node of the tap T5') when the clock clk2 is at low level "0" and selects the output of the D flip-flop D5 (node of the tap T4') when the clock clk2 is at high level "1". As a result, the output L2 of the selector 21 turns out to be Y0, Cb0, Y1, Cr0, . . . as shown in the time chart. Because the output of the D flip-flop D3 (node of the tap T3') is connected to the output L1 of the center tap as it is, the output L1 of the center tap turns out to be Cb0, Y0, Cr0, Y1, Cb2, . . .

Accordingly, the output values L0, L1 and L2 of the three taps turn out, respectively, to be first data string elements Y2, Y1 and Y0 corresponding to the luminance signals of three pixels at time t, to be second data string elements Cb, Cb2 and Cb0 corresponding to the color-difference signals Cb of three pixels at time (t+1), to be first data string elements Y3, Y2 and Y1 corresponding to the luminance signals of three pixels at time (t+2) and to be third data string elements Cr4, Cr2 and Cr0 corresponding to the color-difference signals Cr of three pixels at time (t+3).

The multipliers 30, 31 and 32 multiply the values of the outputs L0, L1 and L2 of the respective taps by the values of the tap coefficients a0, a1 and a2, respectively. The adder 40 adds the multiplication results.

That is, the output L3 of the adder 40 turns out to be (a0·Y2+a1·Y1+a2·Y0) at time t, (a0·Cb4+a1·Cb2+a2·Cb0) at time (t+1), (a0·Y3+a1·Y2+a2·Y1) at time (t+2), and (a0·Cr4+a1·Cr2+a2·Cr0) at time (t+3). These respective operation results are the filter output for the data of the center tap L3.

A filter output for certain data will be represented by affixing "'" to that data hereinbelow. Then, Y1', Cb2', Y2' and Cr2' are outputted from the tap L3 at time t, (t+1), (t+2) and (t+3), respectively. This order is equal to the order of the input data string. That is, it can be seen that the input data string in which the luminance signals Y and the color-difference signals Cb and Cr are interleaved are filtered and outputted by the digital filtering circuit while keeping the order of the input.

The structure of the digital filtering circuit in FIG. 1 may be considered as follows in extending so as to be able to apply to a filtering circuit having a plurality of taps.

That is, it is provided with a delay line composed of (f1/f2)×(N−1) of D flip-flops (D0 through D7), where f1 is transmission clock frequency of the data string (Y, Cr, Cb) supplied to the input node IN, f2 is frequency of the data string elements (Cr, Cb) whose frequency is the least among the data string elements (Y, Cr, Cb) contained in the data string, and N is a number of taps. It is also provided with a plurality of selecting means (20 and 21) for selecting and outputting one out of two or more taps other than the center tap among the plurality of taps of this delay line (D0 through D7). It is then constructed so as to contain a plurality of multipliers (30, 31 and 32) for multiplying the output data of the plurality of selecting means (20 and 21) and the data of the center tap by coefficients, respectively, and an adder (40) for adding the outputs of the respective multipliers (30, 31 and 32).

The above-mentioned delay line (D0 through D7) is operated with the frequency f1 of the above-mentioned data string. Then, the selecting means (20 and 21) are configured so as to process the plurality of data string elements in the time sharing manner by switching the taps connected to the multipliers (30, 31 and 32) so that the interval of the taps is f1/f3 of the D flip-flops based on the center tap, where f1 is the frequency of the data string and f3 is the frequency of the data string element to which the data outputted to the center tap at time selected by the selecting means (20 and 21) belongs.

By configuring as described above, when the data is the data of the luminance signal Y of 13.5 MHz which turns out to be the first data string element and each data of the color-difference signals Cr and Cb of 6.75 MHz which turn out to be the second and third data string elements and when the frequency of the data string in which those data string elements are regularly and periodically inserted or multiplexed is f1=27 MHz, the D flip-flops (D0 through D7) are operated with the frequency f1 of the input data string.

Then, the selector circuits (20, 21) as the above-mentioned selecting means switch the taps connected to the above-mentioned multipliers (30, 31 and 32) so that the interval of the taps selected by the selector circuits (20, 21) is (frequency f1=27 MHz of the data string)/(frequency of the data string element to which the data outputted to the center tap at that time belongs (f3=13.5 MHz in case of the luminance signal Y and f3=6.75 MHz in case of the color-difference signals Cb and Cr)), i.e., two or four D flip-flops based on the center tap. That is, the output of the D flip-flops connected to the multipliers (30, 31 and 32) are switched selectively by the selecting means (20 and 21). Thereby, the plurality of multipliers (30, 31 and 32) and the adder (40) within the digital filtering circuit are used for filtering the luminance signal Y and the color-difference signals Cb and Cr in the time division manner. Accordingly, because the plurality of multipliers (30, 31 and 32) and the adder (40) within the digital filtering circuit are shared in filtering the luminance signal Y and the color-difference signals Cb and Cr, the circuit scale of the digital filtering circuit is reduced.

As it is apparent from the above description, the four delay lines, i.e., the four D flip-flops, are structured as one unit delay line in processing the luminance signal Y and the color-difference signals Cb and Cr conforming to BT. 601. Then, the selecting circuit outputs the data element of the same series selectively out of the four D flip-flops to the multipliers.

Figure 9:
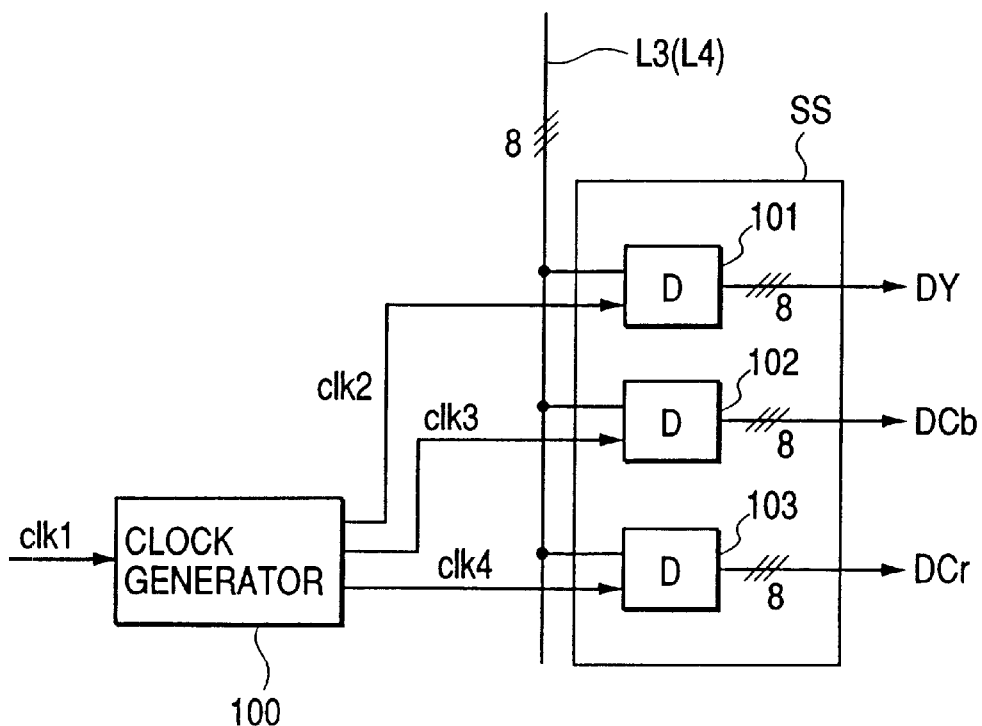
FIG. 9 is a diagram showing a signal separating circuit which can be coupled with a filter output L3 in FIG. 1 or a filter output L4 in FIG. 6.

When it is necessary to separate the filter output L3 into the luminance signal Y and the color-difference signals Cb and Cr, a signal separating circuit SS as shown in FIG. 9 is coupled to the filter output L3. That is, a luminance signal DY, a color-difference signal DCb and a color-difference signal DCr may be obtained separately by connecting the respective inputs of three 8-bit D flip-flops 101, 102 and 103 with the filter output L3 in parallel and by operating clocks clk2, clk3 and clk4 which are different from each other. The respective clocks clk2, clk3 and clk4 are generated by a clock generating circuit 100 which receives the clock signal clk1. The clock clk2 corresponds to a clock obtained by dividing the clk1 into a half, the clock clk3 corresponds to a clock obtained by dividing the clock clk2 into a half and the clock clk4 corresponds to a clock obtained by inverting the phase of the clock clk3. The persons skilled in the art will be able to form these clocks clk2 through clk4 relatively easily.

Figure 10:
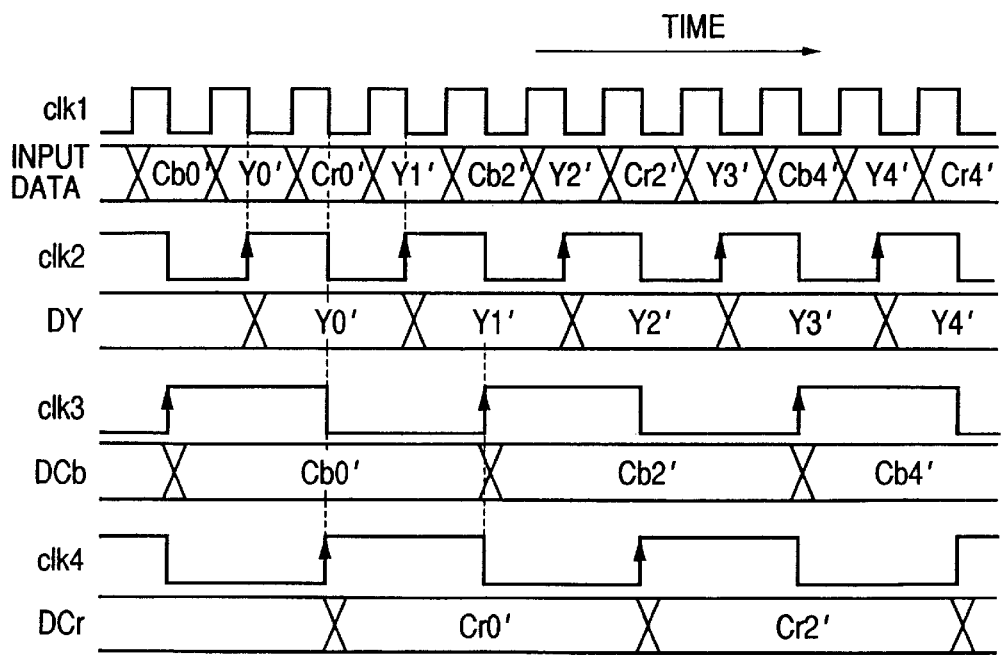
FIG. 10 is a chart showing operation timing of the signal separating circuit in FIG. 9.

FIG. 10 shows operation timing of the signal separating circuit SS shown in FIG. 9. The input data corresponds to the data of the filter output L3 and the D flip-flops 101,102 and 103 latch each data corresponding to the rising edge of the respective clock signals clk2 through clk4. Accordingly, the luminance signal output DY of the D flip-flop 101 turns out to be luminance signals Y0', Y1', Y2', Y3' and Y4', the color-difference signal output DCb of the D flip-flop 102 turns out to be color-difference signals Cb0', Cb2' and Cb4' and the color-difference signal output DCr of the D flip-flop 103 turn out to be color-difference signals Cr0' and Cr2'. Each separated data is written to a memory as a storage unit provided within the semiconductor integrated circuit device or undergoes a desired data processing such as a pixel skipping process.

Figure 3:
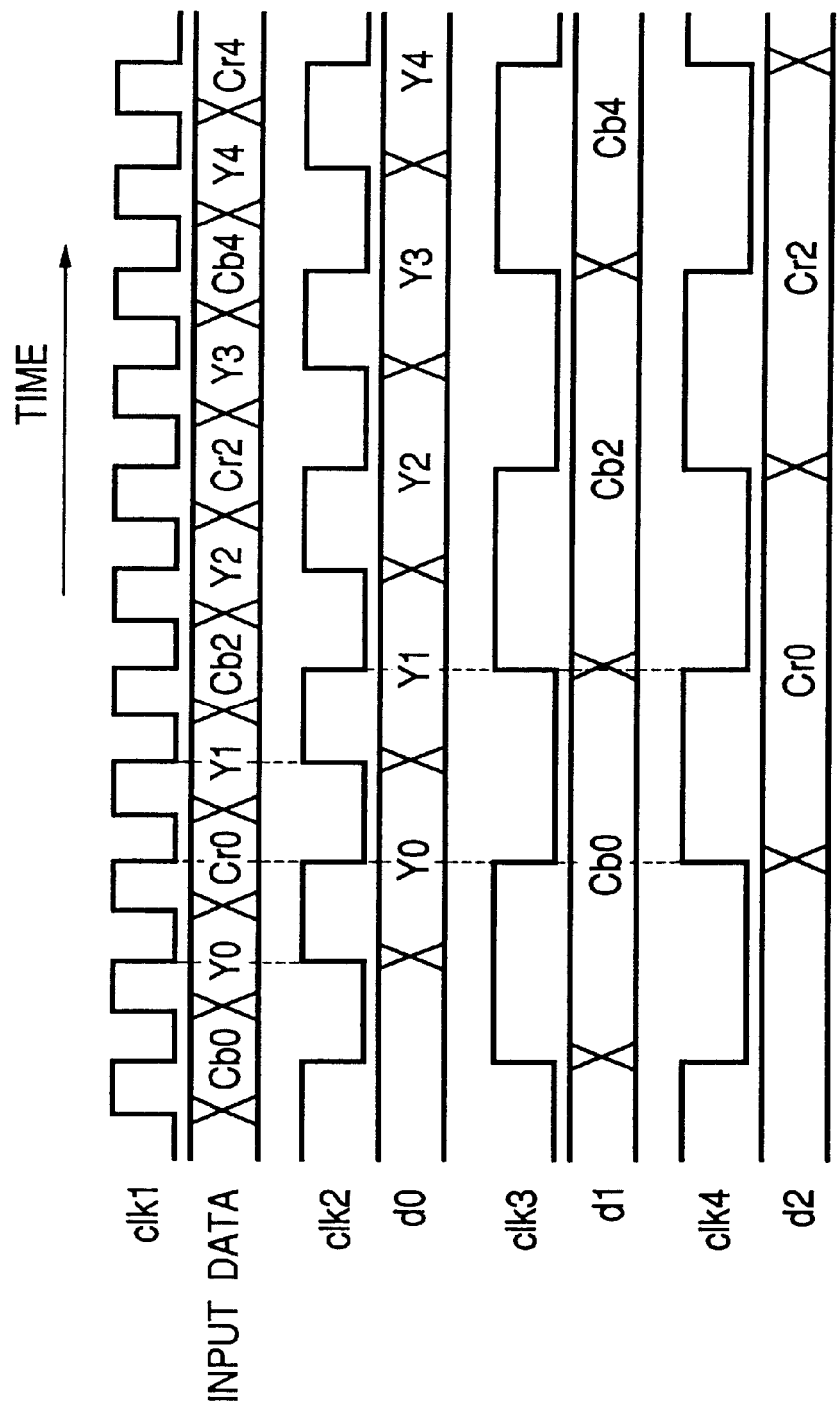
FIG. 3 is a time chart showing an operation of the filtering circuit in FIG. 2.
Figure 4:
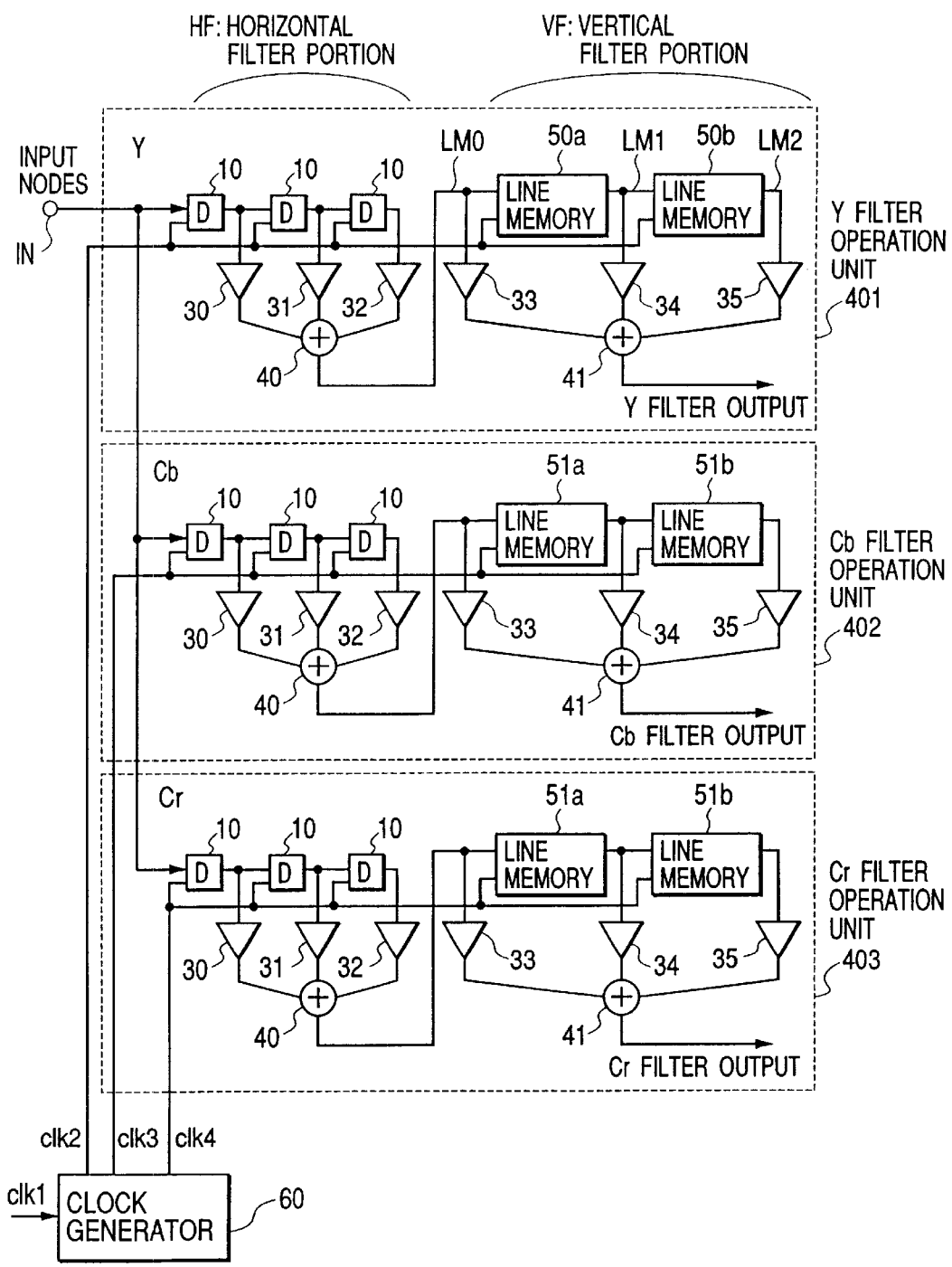
FIG. 4 is a circuit structural diagram showing another example of a digital filtering circuit studied by the inventor of the present application.

According to the present embodiment, one digital filtering circuit may be used for filtering the luminance signal Y and the color-difference signals Cb and Cr in the time division manner as described above. Therefore, as compared to the digital filtering circuit shown in FIG. 3, it allows the circuit scale of the multipliers and the adder in the digital filtering circuit to be reduced to ⅓. In other words, the plurality of multipliers and the adder within the digital filtering circuit are shared in filtering the luminance signal Y and the color-difference signals Cb and Cr. It means that the circuit scale of the digital filtering circuit is reduced. Accordingly, it is possible to reduce the cost of the semiconductor integrated circuit device as a result because the area occupied by the digital filtering circuit on a semiconductor chip on which the semiconductor integrated circuit device is formed is reduced even when the digital filtering circuit constructed as described above is formed within the semiconductor integrated circuit device.

Next, another embodiment of a digital filtering circuit of the invention will be explained. The digital filtering circuit of the present embodiment performs a filtering process of three taps in the two directions of the horizontal direction and vertical direction, respectively, to an input data string of a digital video signal.

Figure 6:
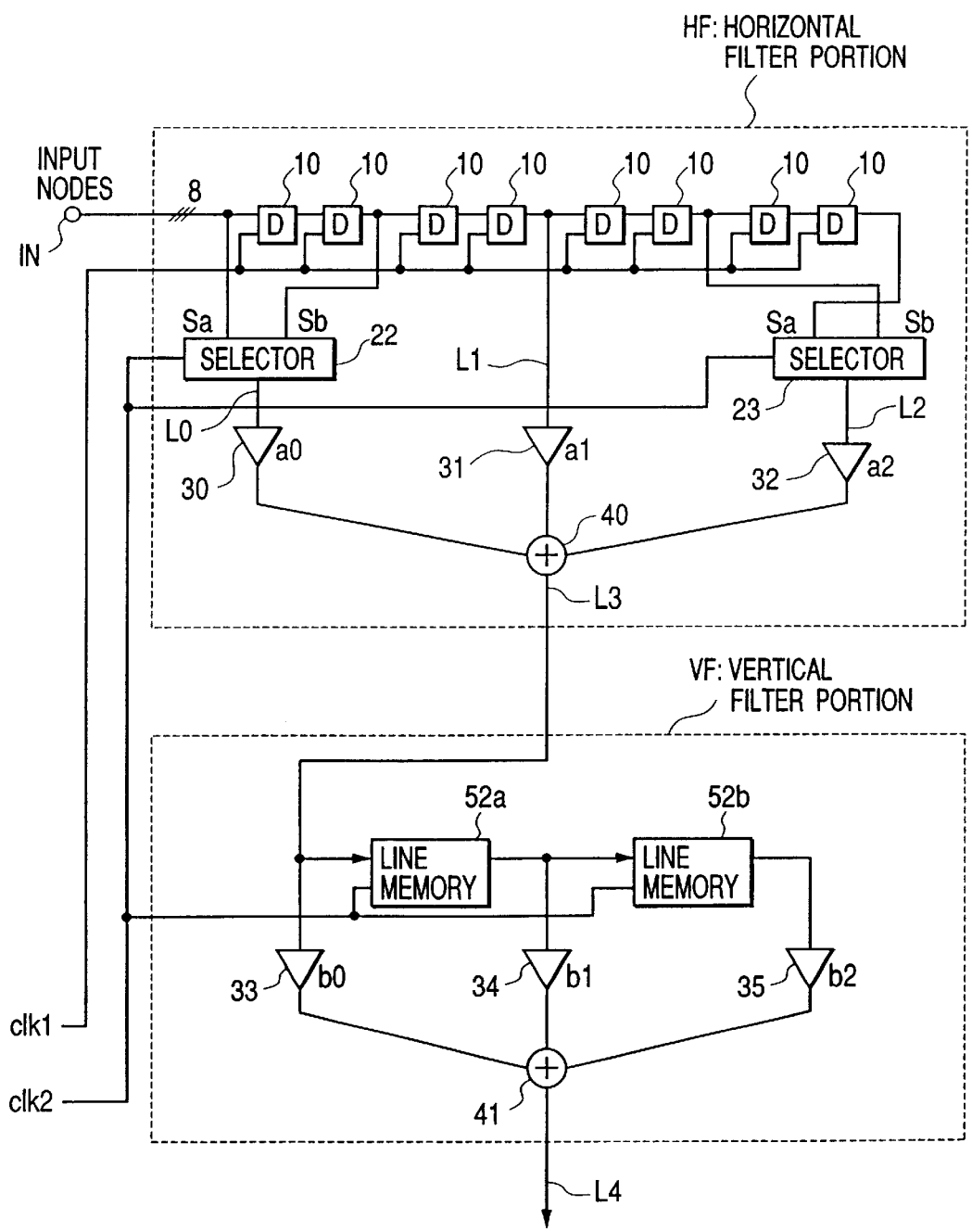
FIG. 6 is a circuit structural diagram showing another embodiment of a digital filtering circuit of the invention.

FIG. 6 is a circuit structural diagram of the other embodiment of the digital filtering circuit of the invention. The digital filtering circuit comprises a horizontal direction filtering section HF referred to as a first filtering section and a vertical direction filtering section VF referred to as a second filtering section. The digital filtering circuit of the previous embodiment shown in FIG. 1 is used for the horizontal direction filtering section HF. Line memories 52a and 52b used in the vertical direction filtering section VF are FIFO (First In First Out) memories operative with the clock clk1 and have a capacity of data of one line of input data string, respectively. That is, they have a capacity of ((data of one line of luminance signal Y)+(data of one line of color-difference signal Cb)+(data of one line of color-difference signal Cr))=((a number of pixels of one line)+(a number of pixels of one line/2)+(a number of pixels of one line/2))=(a number of pixels of one line×2).

The filter output L3 of the horizontal direction filtering section HF is connected to the line memory 52a of the first stage and an output of the line memory 52a of the first stage is connected to an input of the line memory 52b of the second stage. An input of the vertical direction filtering section VF and outputs of the two line memories 52a and 52b are taken as three taps of the vertical direction filtering section VF to multiply tap coefficients b0, b1 and b2 by the multipliers 33, 34 and 35 respectively. An adder 41 adds the respective outputs of the multipliers 33, 34 and 35 and outputs as a filter output L4.

Figure 5:
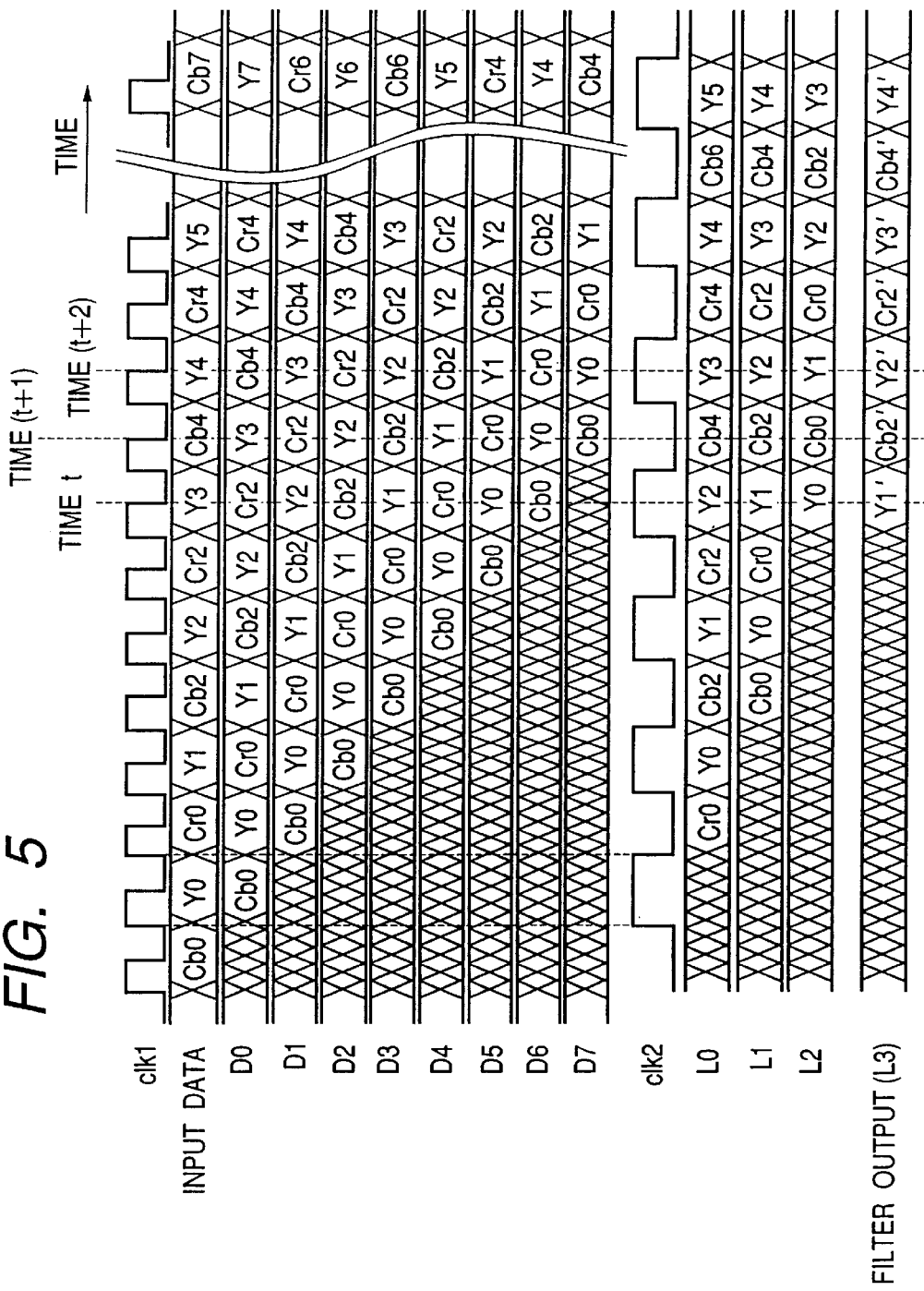
FIG. 5 is a time chart showing an operation of the digital filtering circuit shown in FIG. 1.

Because the output L3 of the horizontal direction filtering section HF is in the state in which the luminance signals Y and the color-difference signals Cb and Cr are multiplexed as shown in FIG. 5, this filter output L4 is also obtained in the state in which the luminance signals Y and the color-difference signals Cb and Cr are multiplexed in the same manner.

When the filter output L4 needs to be separated into the luminance signal Y and the color-difference signals Cb and Cr, the signal separating circuit SS as shown in FIG. 9 is employed. That is, the luminance signal Y, the color-difference signal Cb and the color-difference signal Cr may be separated by connecting the three 8-bit D flip-flops 101, 102 and 103 within the signal separating circuit SS to the filter output L4 in FIG. 6 in parallel and by operating the respective D flip-flops 101, 102 and 103 by different clocks clk2, clk3 and clk4.

In addition to the digital filtering circuit shown in the first embodiment, one digital filtering circuit is used in filtering the luminance signal Y and the color-difference signals Cb and Cr in the time division manner in the filtering process in the vertical direction in the digital filtering circuit of the present embodiment. Therefore, the effect of reducing the number of the multipliers and the adders is more significant.

It is noted that although the case of handling the inputted image data as it is without converting its size has been explained in the two embodiments described above for the convenience of the explanation, it is needless to say that the inventive effect may be realized in the same manner even when a size of an outputted image of the filtering process is different from an inputted image size by setting the capacity of the line memory at a data amount of one line of a size of an image to be outputted. In other words, it may be realized as follows. That is, image data of a desired image size that, e.g., one line contains 360 pixels, is found by performing an image skipping process to the filter output L3 of the horizontal direction filtering section HF and the image skipped pixel data is stored in the memory once. Thereafter, the image-skipped pixel data is read from the memory to supply to the input of the vertical direction filtering section VF. It is noted the image size may be changed as desired by setting the capacity of the line memory of the vertical direction filtering section VF at the capacity of 360 pixels. In this case, because a number of pixels of one line in the horizontal direction is changed from 720 pixels to 360 pixels, i.e., to 360/720=½, the FIFO memory which is the line memory may be operated with the frequency of f1/2. That is, when the pixel skipping rate in the horizontal direction is 1/n (n: integer), the FIFO memory may be operated with the frequency of f1/n (f1 is the frequency of data string).

It is noted that in this case, the adding operation of the adder 41 shown in FIG. 6 is controlled with the frequency of f1/n and transmits an output signal with frequency corresponding to f1/n. That is, in a case when an image skipping process is performed, the data latching operation of the FIFO memories 52a and 52b and the adding operation of the adder 41 in FIG. 6 are controlled by a clock signal clkp having the frequency fp different from the frequency of the clock clk1 shown in FIG. 6. It will be readily understood for the person skilled in the art that the frequency fp of the clock signal clkp is decided in connection with operating frequency of a signal processing circuit of the next stage not shown which receives the transmission frequency of the output signal of the adder 41 or the output of the adder 41.

While the preferred embodiments of the invention have been described above, the invention is not limited to the examples shown in the embodiments and may be changed variously within the scope of the sprit of the invention. For instance, although it is needless to say that the inventive digital filtering circuit is applicable to the digital filtering circuit for the data string inputted from the outside in the data format in which the luminance signals Y and the color-difference signals Cb and Cr are multiplexed like the above-mentioned ITU-R Recommendation BT. 601, it is also applicable to a digital filtering circuit for the data string of the luminance signal Y and the color-difference signals Cb and Cr which are separated from the beginning. For example, it is possible to multiplex a luminance signal Y and color-difference signals Cb and Cr read from the memory to convert into one data string and to process the data string by the inventive digital filtering circuit in outputting to the outside in the data format in which the luminance signals Y and the color-difference signals Cb and Cr are multiplexed after implementing filtering operation to the data written on the memory per the luminance signal Y and the color-difference signals Cb and Cr. It allows the circuit scale to be reduced because one digital filtering circuit will do as compared to the case of making one data string after implementing the filtering process per every luminance signal Y and color-difference signals Cb and Cr.

Still more, although the digital filtering circuit in which the data string of a digital video signal such as the ITU-R Recommendation BT. 601 is inputted has been exemplified and explained in the above description, the inventive digital filtering circuit is applicable not only to the filtering process for the digital video signal but also to the digital filtering circuit for processing a data string in which a plurality of data strings are multiplexed. Specifically, it is effective when the plurality of different data strings are data strings whose frequencies are different from each other.

It is also needless to say that the invention may be provided in the following mode. That is, it is also conceivable for the digital filtering circuit to have a mode stored in a storage medium and distributed as data which can be read by computers. In such a case, information on logical circuits and information on circuit connection of the digital filtering circuit shown in FIGS. 1 through 6 defined by HDL (Hardware Description Language) are stored in the above-mentioned storage medium. There is also a case when the digital filtering circuit shown in FIGS. 1 through 6 is stored in the above-mentioned storage medium as data which can be read by computers, or as pattern information of various photo-lithographic mask patterns such as diffusion layer pattern information and wiring pattern information used in manufacturing the semiconductor integrated circuit device.

As it is apparent from the above-mentioned embodiments, the invention allows one digital filtering circuit to share the filtering processes of the luminance signal Y and the color-difference signals Cb and Cr in the time division manner without separating a data string in which a luminance signal Y and two kinds of color-difference signals Cb and Cr are inserted regularly and periodically to filter by digital filtering circuits provided separately similar to ITU-R Recommendation BT. 601. Accordingly, as compared to the case of providing the digital filtering circuits separately and respectively for the luminance signal Y and the color-difference signals Cb and Cr, the number of the multipliers and adders may be reduced and the circuit scale of the whole digital filtering circuit may be reduced. This effect is significant especially in the digital filtering circuit conducting a filtering process of a large number of taps.

The plurality of multipliers and the adders within the digital filtering circuit are shared in filtering the luminance signals Y and the color-difference signals Cb and Cr. This means that the circuit scale of the digital filtering circuit is reduced. Accordingly, an area occupied by the digital filtering circuit on a semiconductor chip on which the semiconductor integrated circuit device is formed is reduced even when the digital filtering circuit having the above-mentioned structure is formed within the semiconductor integrated circuit device, so that the cost of the semiconductor integrated circuit device may be lowered as a result.

What is claimed is:

1. A digital filtering circuit for filtering a data string in which data of a plurality of data string elements in which frequency of at least one data string element is different from transmission frequency of the other data string element are multiplexed, comprising:

a delay line composed of $(f1/f2)\times(N-1)$ D flip-flops, where f1 is transmission frequency of said data string, f2 is transmission frequency of a data string element whose transmission frequency is least among the data string elements contained in said data string and N is a number of taps;

a plurality of selector circuits for outputting by selector one out of two or more taps other than a center tap among the plurality of taps of said delay line;

a plurality of multipliers for multiplying output data of said plurality of selector circuits and data of the center tap by respective coefficients; and an adder for adding outputs of said multipliers;

wherein said delay line is operated with the transmission frequency of said data string and said selector circuits process said plurality of data string elements by switching the taps connected to said multipliers so that the interval between the taps is f1/f3 of D flip-flops based on the center tap, where f1 is the transmission frequency of the data string and f3 is the transmission frequency of the data string element to which data outputted to the center tap at the time selected by said selector circuit belongs.

2. The digital filtering circuit according to claim 1, wherein said digital filtering circuit is formed on a semiconductor chip.

3. The digital filtering circuit according to claim 1, wherein said digital filtering circuit further contains a second digital filtering circuit, comprising:

a FIFO memory arranged so as to receive the output signal of said adder and has a capacity for storing at least one line of a second data string conforming to the output signal of said adder;

a plurality of second multipliers for multiplying a plurality of taps which are set at an input of said FIFO memory and at the position of data interval of n lines (n is an integer of 1 or more) from the input of said FIFO memory by respective coefficients; and a second adder for adding respective outputs of said plurality of second multipliers;

wherein said FIFO memory is operated with transmission frequency of the output signal of said second adder and the process of said plurality of data string elements is performed in a time division manner.

4. The digital filtering circuit according to claim 1, wherein the data string elements of said data string are a luminance signal Y and two color-difference signals Cb and Cr and said data string is a digital video signal in which the ratio of sampling frequencies of said luminance signal Y and said two color-difference signals Y:Cb:Cr is 4:2:2.

5. A digital filtering circuit for filtering in a second direction by a second filtering circuit after filtering in a first direction by a first filtering circuit to units of data having two-dimensional structure arranged so that data of a plurality of data string elements of one line are interleaved in the first direction and data of the same data string elements among said plurality of data string elements are arrayed in the second direction orthogonal to said first direction;

wherein said first filtering circuit comprises:

a first delay line composed of $(f1/f2)\times(N-1)$ D flip-flops, where f1 is transmission frequency the data string, f2 is transmission frequency of a data string element whose transmission frequency is least among the data string elements contained in said data string and N is a number of taps;

a plurality of selector circuits for outputting by selector one out of two or more taps other than a center tap among the plurality of taps of said first delay line;

a plurality of first multipliers for multiplying output data of said plurality of selector circuits and data of the center tap by respective coefficients; and a first adder for adding outputs of said first multipliers; and wherein said second filtering circuit comprises:

a line memory arranged so as to receive the output signal of said first adder and having a capacity for storing the second data string conforming to the output signal of said first adder by at least one line;

a plurality of second multipliers for multiplying a plurality of taps set at an input of said FIFO memory and at the position of data interval of n line (n: integer of 1 or more) from the input of said line memory by respective coefficients; and a second adder for adding the respective outputs of said plurality of second multipliers.

6. The digital filtering circuit according to claim 5, wherein the data string elements of said data string are a luminance signal Y and two color-difference signals Cb and Cr and said data string is a digital video signal in which the ratio of sampling frequencies of said luminance signal Y and said two color-difference signals Y:Cb:Cr is 4:2:2.

7. The digital filtering circuit according to claim 5, wherein said digital filtering circuit is formed on a semiconductor chip.

* * * * *